(12) United States Patent
Emerson et al.

(10) Patent No.: US 7,340,700 B2
(45) Date of Patent: Mar. 4, 2008

(54) METHOD FOR ABSTRACTION OF MANUFACTURING TEST ACCESS AND CONTROL PORTS TO SUPPORT AUTOMATED RTL MANUFACTURING TEST INSERTION FLOW FOR REUSABLE MODULES

(75) Inventors: Steven Emerson, Chanhassen, MN (US); Jonathan Byrn, Kasson, MN (US); Donald Gabrielson, Rochester, MN (US); Gary Lippert, Kasson, MN (US)

(73) Assignee: LSI Logic Corporation, Milpitas, CA (US)

( * ) Notice: Subject to any disclaimer, the term of this patent is extended or adjusted under 35 U.S.C. 154(b) by 272 days.

(21) Appl. No.: 11/140,392

(22) Filed: May 27, 2005

(65) Prior Publication Data

US 2006/0271904 A1 Nov. 30, 2006

(51) Int. Cl.
*G06F 17/50* (2006.01)
(52) U.S. Cl. .......................................... 716/4
(58) Field of Classification Search .............. 716/4, 716/11
See application file for complete search history.

(56) References Cited

U.S. PATENT DOCUMENTS

| | | | |
|---|---|---|---|
| 6,775,779 B1 | 8/2004 | England et al. | 713/200 |
| 7,155,693 B1* | 12/2006 | Rodman | 716/8 |
| 2003/0115562 A1* | 6/2003 | Martin et al. | 716/5 |
| 2003/0145297 A1* | 7/2003 | Cote et al. | 716/6 |
| 2004/0045015 A1* | 3/2004 | Haji-Aghajani et al. | 719/328 |
| 2004/0254755 A1 | 12/2004 | Byrn et al. | 702/117 |
| 2005/0144585 A1* | 6/2005 | Daw et al. | 716/18 |
| 2005/0198597 A1* | 9/2005 | Zhu et al. | 716/4 |
| 2006/0036972 A1* | 2/2006 | Barbera et al. | 716/1 |
| 2006/0259884 A1* | 11/2006 | Fong et al. | 716/5 |
| 2006/0271890 A1* | 11/2006 | Hekmatpour et al. | 716/5 |

OTHER PUBLICATIONS

F. Fernandes et al.; "A Probabilistic Method for the Computation of Testability of RTL Constructs," *Design, Automation and Test in Europe conference and Exhibition*, vol. 1, 2004, Paris, France, pp. 10176-10181.

M.B. Santos et al.; "RTL Test Pattern Generation for High Quality Loosely Deterministic BIST," *Design, Automation and Test in Europe Conference and Exhibition*, 2003, Munich, Germany, 10994-10999.

(Continued)

*Primary Examiner*—Jack Chiang
*Assistant Examiner*—Suresh Memula
(74) *Attorney, Agent, or Firm*—Westman Champlin & Ke (57) ABSTRACT

A system for RTL test insertion in an integrated circuit layout pattern includes a core module, a test wrapper, and a smart wrapper. The core module describes a function defined by logical elements, interconnections between logical elements, input pins and output pins. The test wrapper is adapted to encapsulate the core module and to create test pins representing the core module. The smart wrapper is adapted to encapsulate the test wrapper and to assign the test pins to a non-asserted state. The smart wrapper is adapted to place an assertion on one or more of the test pins for static or dynamic testing of the integrated circuit layout pattern.

19 Claims, 11 Drawing Sheets

OTHER PUBLICATIONS

A. Krstic et al.; "Embedded Software-Based Self-Test for Programmable Core-Based Designs," *IEEE Design & Test of Computers*, 2002, pp. 18-27.

Y. Zorian.; "Embedded Test complicates SoC Realm," *EE Times*, article, Dec. 2000.

A. Sehgal. et al.; "IEEE P1500-Compliant Test Wrapper Design for Hierarchical Cores," IEEE Transactions International Test Conference, 2004, pp. 1203-1212.

V. Iyengar et al.; "Test Wrapper and Test Access Mechanism Co-Optimization for System-on-Chip," *Journal of Electronic Testing: Theory and Applications 18*, 2002, pp. 213-230.

D. Cassell.; "A Randomization-test Wrapper for SAS® PROCs," Paper 251-27, pp. 1-4, 2002.

M. Ricchetti.; "Overview the Proposed IEEE P1500 Scaleable Architecture for Testing Embedded Cores," IEEE P1500 Architecture Task Force, 1999, pp. 1-13.

R. Dorsch et al.; Adapting an SoC to ATE Concurrent Test Capabilities, *IEEE International Test Conference*, 2002, pp. 1169-1175.

Mourani, M. & Papachristou, C.; "An ILP Formulation to Optimize Test Access Mechanism in System-on-Chip Testing," 2000.

\* cited by examiner

METHOD FOR ABSTRACTION OF MANUFACTURING TEST ACCESS AND CONTROL PORTS TO SUPPORT AUTOMATED RTL MANUFACTURING TEST INSERTION FLOW FOR REUSABLE MODULES

CROSS-REFERENCE TO RELATED APPLICATION

None.

FIELD OF THE INVENTION

The present disclosure relates to testing of integrated circuit designs, and more particularly, to systems and methods for automated test insertion and connection to chip-level test resources for integrated circuit designs.

BACKGROUND OF THE INVENTION

An integrated circuit chip (hereinafter referred to as an "IC" or "chip") includes cells and inter-cell connections supported by a substrate. A cell is a group of one or more circuit elements, such as transistors, capacitors, resistors, and other basic circuit elements grouped to perform functions, both arithmetic and logical. A plurality of cells grouped together to perform functions can be referred to as a module. Some modules are designed to be reusable on different chips.

Conventionally, chip designers reuse both modules (sometimes called "macrocells") and complex modules (sometimes called "cores" or "IP") in order to speed the overall design process. There are many existing modules that chip designers would like to be able to incorporate into new chip designs without changes. However, the reuse of such modules introduces problems with respect to testing and verification of the overall design. While "design for test" (DFT) structures can be built into new systems, the existing modules and cores may not include test structures or may include test structures that are incompatible with the current test insertion strategies.

Historically, many different approaches have been used to make designs more testable and/or to actually insert test structures into the design, including both manual and automated approaches. Such test insertion is typically performed separately from functional Register Transfer Language (RTL) design of chips. Manual test insertion requires extra design work in a design process that is already very complex and lengthy. The investment made in manual test insertion can be risky and is susceptible to changes because test insertion strategies change over time. Since RTL coding is typically a manual process, hard-coding specific test strategies into the RTL code is not desirable. Moreover, there are commercially available design tools that are adapted for inserting test structures into a gate-level netlist, so such manual coding is not necessary.

Such automated test insertion is advantageous in that the modules can be reused as-is without design changes for test insertion. Additionally, automated test insertion can be easily adapted to different test insertion flows as such flows evolve. Currently, automated test insertion is performed at the gate level, in part, due to the relative ease with which tools can be developed to insert test structures at this level as compared to automated test insertion at the RTL level. Test insertion is also performed at the gate level because, conventionally, physical design flows are based on what is called gates-to-placed gates timing closure flow.

A Gates-to-Placed-Gates flow is used when an already available synthesized and "test ready" netlist is available from a logic synthesis tool, and a physical design and placement system is then used to place the design and to perform physical scan ordering. The design is first synthesized with scan from the RTL in the logic synthesis tool using wire-load models to estimate timing. The synthesized netlist is placed and optimized in the physical design and placement system. Scan-chain ordering is performed within the physical design and placement system environment to stitch the scan chains based on physical information, thereby achieving timing closure and optimizing the layout for routability. The gates-to-placed-gates flow is the traditional design flow where RTL is synthesized to create a gate level netlist, which is then timing closed using estimated interconnect loading before being physically placed. The Gates-to-Placed-Gates flow is currently used when the starting point for the reusable module is a gate-level implementation. When used by itself, Gates-to-Placed-Gates flow is sub-optimal for state-of-the-art chip design. In particular, it is sub-optimal because the logic synthesis step does not take into account the effects of physical placement of the gates, but instead uses only a wireload to estimate the effects.

Another type of design flow is called RTL-to-Placed-Gates flow. RTL-to-Placed-Gates flow uses RTL source code, timing information, Design Rule Check (DRC) constraints, design libraries, and DFT information, and the like to determine and generate legalized gate placement for routing. The RTL-to-Placed-Gates flow incoporates physical characteristics and timing information as part of its mapping and placement from RTL-to-Gates. This type of flow uses traditional scan synthesis flow within a physical compiler environment to perform scan chain ordering. In most instances, the test insertion is performed using a gate-level representation. RTL-to-Placed Gates flow is a more optimal design flow for contemporary chip designs than Gates-to-Placed-Gates flow.

It is not desirable to do gate-level test insertion, in the traditional sense, after the RTL-to-Placed-Gates flow. Specifically, adding test logic to a placed netlist will disturb the timing closure that has already been completed, because some cells will need to be moved to insert the additional test logic. It is desirable to perform test insertion at the RTL level, because all logic cells (both functional and test related) are accounted for as the placement is completed during synthesis. However, RTL level test insertion is difficult. Typically, test insertion flows (including RTL-to-Placed-Gates) do some sort of mapping from RTL to logic cells and then insert tests at the logic cell level.

Therefore, there is an ongoing need for improvements in computer-aided test insertion systems and methods for integrated circuit design. Embodiments of the present invention provide solutions to these and other problems and provide advantages over the prior art.

BRIEF SUMMARY OF THE INVENTION

A system for RTL test insertion in an integrated circuit layout pattern includes a core module, a test wrapper, and a smart wrapper. The core module describes a function defined by logical elements, interconnections between logical elements, input pins and output pins. The test wrapper is adapted to encapsulate the core module and to create test pins representing the core module. The smart wrapper is adapted to encapsulate the test wrapper and to assign the test pins to a non-asserted state. The smart wrapper is adapted to place an assertion on one or more of the test pins for static or dynamic testing of the integrated circuit layout pattern.

A system for insertion of a test within an integrated circuit layout pattern includes a core module, a test wrapper and a smart wrapper. The core module describes a function defined by logical elements, interconnections between logical elements, input pins and output pins. The core module defines a test structure with module test pins. The RTL test wrapper is adapted to encapsulate the core module and to create test pins coupled to the module test pins. The RTL smart wrapper is adapted to tie off and hide test pins of the RTL test wrapper.

A system for test insertion in an integrated circuit layout pattern includes a core module, a test wrapper, and a smart wrapper. The core module describes a function defined by logical elements, interconnections between logical elements, input pins and output pins. The test wrapper is adapted to encapsulate the core module and to create test pins representing test structures of the core module. The smart wrapper is adapted to encapsulate the test wrapper and to assign the test pins to a non-asserted state. The smart wrapper is adapted to hide the test pins.

DETAILED DESCRIPTION OF ILLUSTRATIVE EMBODIMENTS

Figure 1:
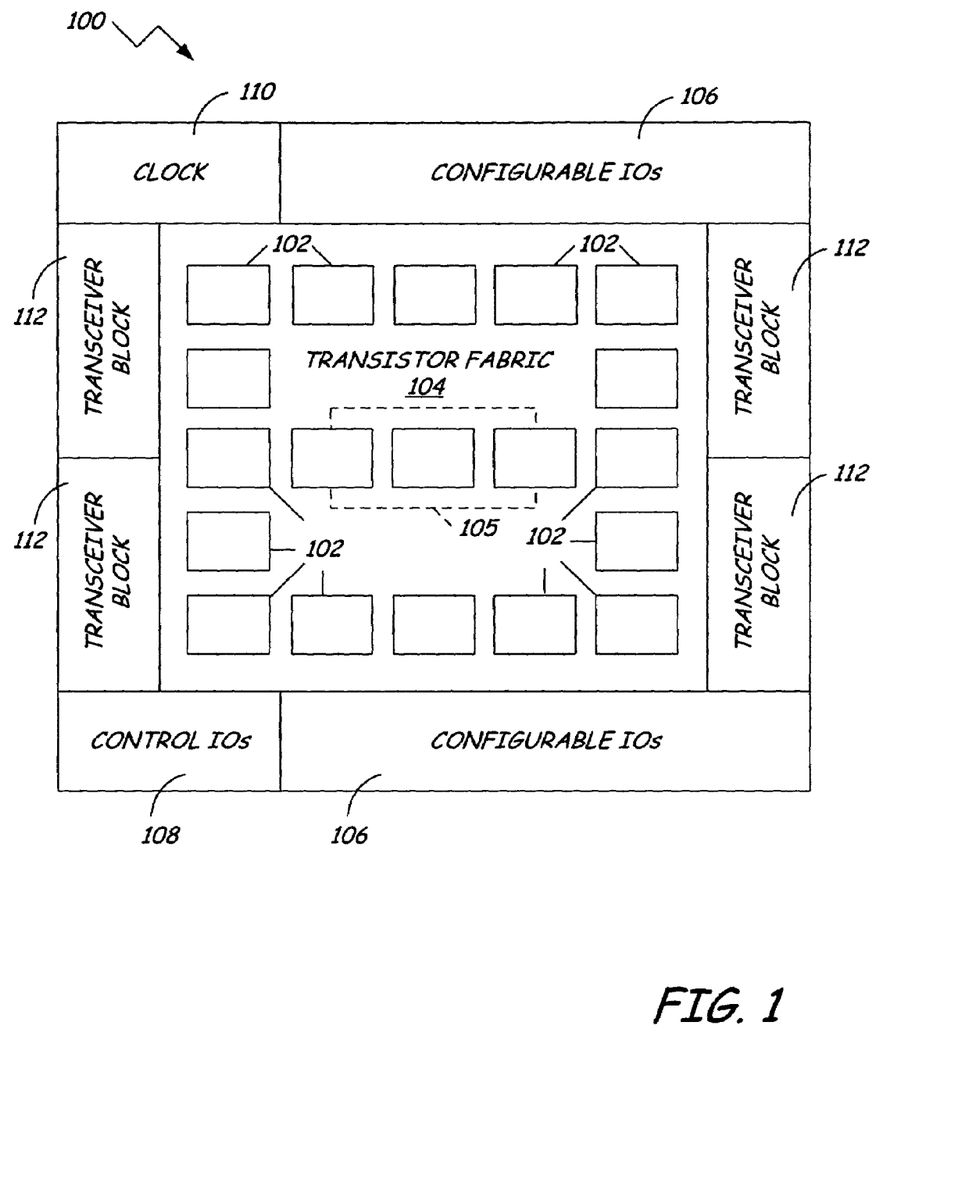
FIG. 1 is a simplified block diagram of an integrated circuit layout on a pre-fabricated silicon wafer according to an embodiment of the present invention.

FIG. 1 illustrates an example of a pre-manufactured silicon wafer (which may be referred to as a "slice") 100, which can be utilized in conjunction with embodiments of the present invention. Selected cells, modules, and core may be mapped onto the slice 100 according to one embodiment of the present invention. In this example, slice 100 includes placed and routed memories 102, transistor fabric 104, configurable inputs and outputs (I/Os) 106, dedicated I/Os (such as control I/Os 108), clock 110, and transceiver blocks 112. The particular combination of resources on slice 100 can be chosen based to fit the specific implementation. Customer logic 105 is shown in phantom to illustrate that the customer logic 105 can be mapped onto the slice 100 according to the desired functionality and to make use of resources placed and routed in the fabric 104.

The transistor fabric 104 is comprised of a plurality of R-Cells. An R-Cell is a multi-transistor element configured by metal. During the design layout process, R-Cells of the transistor fabric 104 can be configured as gates, flip-flops or memory. The transistor fabric 104 provides the basis for the implementation of a user's logic. Generally, R-Cells are made up of specially sized "N" and "P" type transistors that are fabricated into the slice 100 to form diffused regions arranged in a regular pattern throughout the slice 100.

Placed and routed memories 102 define memory spaces that can be configured to meet design specifications. The placed and routed memories 102 can be combined with Random Access Memory (RAM) blocks constructed from the transistor fabric 104 to create larger memories, allowing designers to specify memory arrays of arbitrary width and depth.

To provide flexibility in layout and design, configurable I/Os 106 can be configured to meet various signaling standards, such as low-voltage transistor-transistor logic (LVTTL), low voltage differential signaling (LVDS), high-speed transceiver logic (HSTL), and series-stub terminated logic (SSTL). Additionally, high-speed memory interfaces can be designed using these configurable I/Os 106. For example, hard cell DDR macros can be located just behind the configurable I/Os 106 to run at high clock rates.

Generally, there are three forms in which modules or macros can be delivered: placed and routed, netlist without placement information, and unsynthesized RTL. Additionally, the term "placed netlist" refers to a netlist that describes an interconnection of logic cells (AND, OR, NOR, exclusive-or, Flip-Flop circuits, and the like), which also includes physical placement information. From a placed netlist, routing tools (such as wire/interconnect routing tools) can perform wire load estimates and route planning. A netlist includes a list of logical cells without placement information. Placed and routed macros can be standard cell, mixed signal or full custom logic that are fully placed, routed and verified on the slice 100. Placed and routed macros have the same high performance specifications as a cell-based ASIC, are placed and routed within a region of the transistor fabric 104, and can be relocated as a single block. The netlist without placement information represent macros that are delivered as a netlist with timing constraints. Routing of such macros is typically completed during chip level routing. Unsynthesized RTL macros are implemented in the transistor fabric 104, are not placed or routed, and provide maximum flexibility for the designer because the RTL code is synthesized during the physical synthesis step of the design process.

The present disclosure is directed to a smart wrapper (shown in FIG. 4A), which provides a basis for a simplified test insertion scheme for an integrated circuit such as that shown in FIG. 1. The smart wrapper allows the customer to insert test structures easily into any circuit design.

Figure 2:
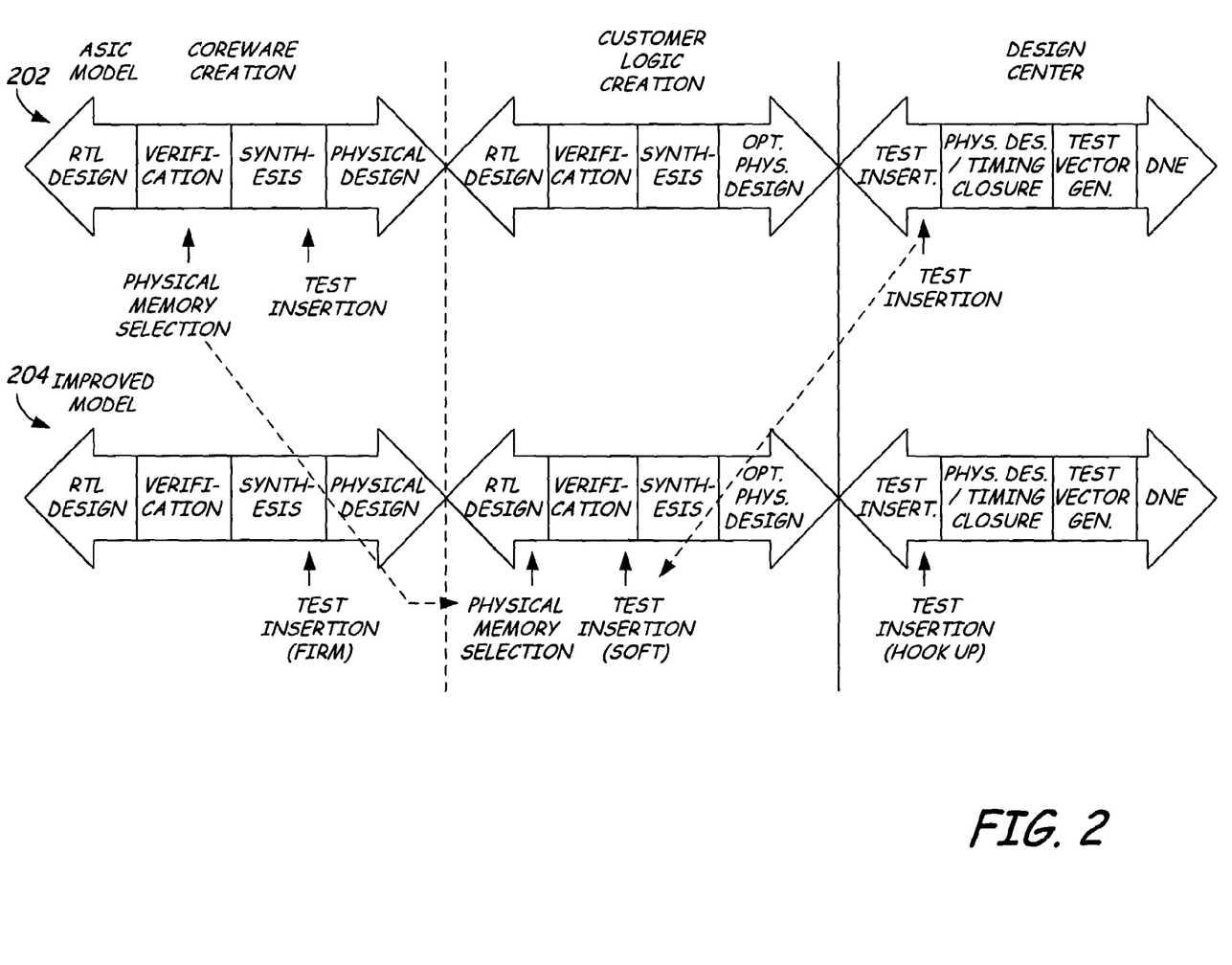
FIG. 2 is a simplified design flow diagram illustrating customer-based test insertion according to an embodiment of the present invention.

FIG. 2 illustrates a simplified design flow diagram illustrating differences between an ASIC model and an improved model design flow using the same logic modules for the two designs. In the ASIC model (generally indicated by reference numeral 202), during core creation, the designer performs RTL design, design verification (including physical memory selection), design synthesis (including test insertion), and physical design. The customer then performs RTL design, design verification, design synthesis, and optionally physical design for the customer logic. Finally, the design center (which may be part of a computer-aided design tool) performs test insertion, physical design and timing closure, test vector generation, and then proceeds to fabrication (DRC, netlist, ebeam or DNE).

In the improved model (generally indicated by reference numeral 204), the core creation phase proceeds in much the same manner as the ASIC model. The designer performs RTL design, design verification, design synthesis (including test insertion for macros described by a netlist without placement information), and physical design. Unlike the ASIC model 202, model 204 allows the user to delay physical memory selection and requires test insertion only for netlist without placement information macros. During the customer logic creation phase, the customer performs RTL design (including physical memory selection), design verification (including test insertion for unsynthesized RTL macros), design synthesis, and optionally physical design for the customer logic. Finally, the design center (which may be part of a computer-aided design tool) performs test insertion (e.g. test hook up), physical design and timing closure, test vector generation, and then proceeds to fabrication (DRC, netlist, ebeam or DNE).

In general, a "smart wrapper" is used in model 204, which appears to the design tools like test structures are inserted, even if the underlying modules or blocks do not include RTL test insertion. This makes it possible to perform testing of the design, even with modules that are not provided with test structures. In general, the smart wrapper is used for unsynthesized RTL modules if test structures exist that need to be wired to global test resources of the chip. Netlist without placement information macro wrappers are used to represent test structures that appear in the netlist. Wrappers for placed and routed macros allow existing test structures to be wired to top-level test resources.

Figure 3:
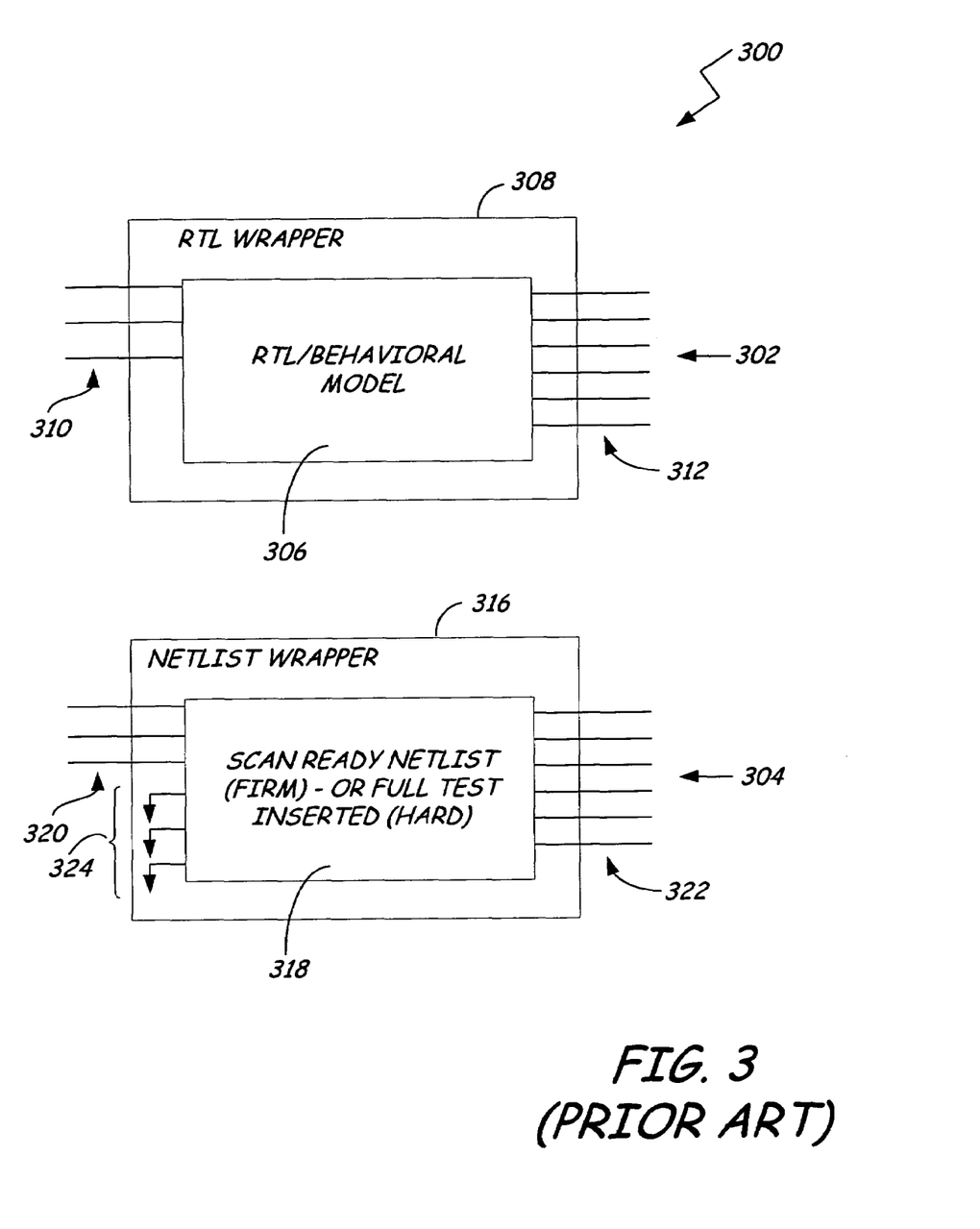
FIG. 3 is a simplified block diagram of a conventional wrapper scheme for an Application-Specific Integrated Circuit (ASIC) core, enabling automated test connections to be made at the chip-level while preserving a smooth design flow.

FIG. 3 is a conventional wrapper scheme for an ASIC core 300. The core 300 includes an RTL module 302 and a netlist module 304. The RTL module 302 includes an RTL wrapper 308 that is wrapped around an RTL/Behavioral model 306 with input pins 310 and output pins 312. The RTL/Behavioral model 306 represents a core described in RTL code.

The netlist module 304 has the same module name and pinouts as the RTL module 302. The netlist module 304 includes a netlist wrapper 316 that is wrapped around a scan ready netlist (without placement information) or full test-inserted (placed and routed) model 318 with input pins 320, output pins 322, and test pins 324. Test pins 324 are buried and tied off internally. The term "scan-ready" netlist means the netlist has all test structures inserted, but does not have the scan chains hooked up. The scan chains are typically hooked up after placement so that an efficient scan chain routing can be accomplished.

Generally, the core designer delivers the RTL model 306, RTL wrapper 308, netlist 318 and netlist wrapper 316 to the customer. The wrappers 308 and 316 are created for the RTL model 306 and the netlist 318, respectively. The system instantiates the RTL wrapper 308. At synthesis, the netlist wrapper 316 and the netlist 318 are swapped in at the RTL wrapper level. The customer inserts test structures and uses the test-inserted netlist for final gate simulations and analysis. This process works for both placed and routed macros and netlist without placement information macros.

Referring now to an embodiment of the present invention, an RTL wrapper is used, which provides a means for test insertion without modifying the core module. For example, the test wrapper can be wrapped around a third-party core, without requiring core modification. Additionally, a smart wrapper can be added around the test wrapper to bury test signals so that a customer can instantiate a functional view of the core without having to be concerned with test pins. The smart wrapper can be used to add (place) assertions on the test pins for both dynamic (simulation-based) verification and for static (equivalence) checks. The dynamic verification ensures that the test signals are hooked up correctly and that they do not toggle during a functional simulation. The static checks can be used to make connectivity-based checks at a later step.

In general, a wrapper can be conceptualized as a physical frame around a core module. Wrappers, however, exist as modules or functions within RTL code, which are used to instantiate objects that they "frame." For example, an RTL test wrapper instantiates a core module and manufactures the existence of test pins, whether or not the core module includes test structures with corresponding test pins. In effect, the test wrapper can "fake" the existence of test pins and structures within the core module. A design tool can then be used to run a simple RTL test insertion process that parses the RTL code to find the smart wrappers and to rewire the top level of the chip design hierarchy to connect test related pins to chip-level test resources. During RTL-to-Placed-Gates flow, the test-inserted netlist (such as a placed and routed module, a netlist without placement information, and the like) can be switched (swapped) out. Alternatively, a gate-level test insertion step (still within the RTL-to-Placed-Gates flow) can be used to add test logic to an RTL code block. In this way, the present invention allows for chip-level RTL test insertion without having to solve the problem of RTL test insertion, in part, by relying on existing gate-level test-insertion techniques. Thus, the design flow can connect the test wrapper test pins to chip-level test resources and apply tests to layouts with core modules that do not necessarily support such testing.

A smart wrapper (which is wrapped around the RTL test wrapper) instantiates the RTL test wrapper and ties off the test pins of the RTL test wrapper, preferably to a deasserted state. Additionally, both smart wrappers and test wrappers may include logic modules or functions adapted to aid in test procedures. For example, test wrappers can include bypass circuits for bypassing core modules with no test structures. Alternatively, test wrappers can include complex test circuitry for testing the core module and associated interconnections. The smart wrapper typically buries the test pins, but the smart wrapper can also be used to place assertions on the buried test pins.

Figure 4A:
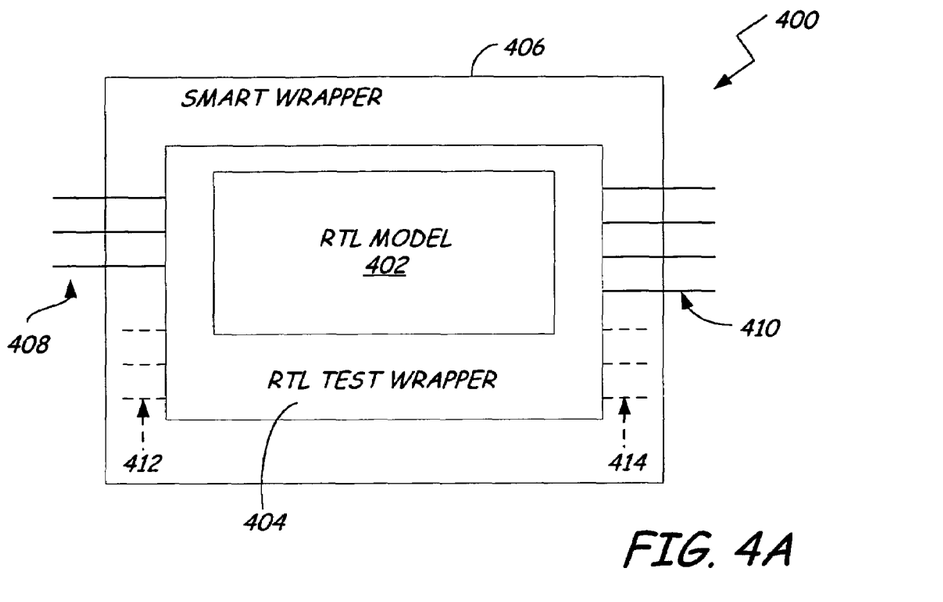
FIG. 4A is a simplified block diagram of an RTL model with RTL test wrapper and a smart wrapper according to an embodiment of the present invention.

FIG. 4A is a simplified block diagram of a unsynthesized RTL macro 400 with an RTL test wrapper and a smart wrapper according to an embodiment of the present invention. The unsynthesized RTL macro 400 includes an RTL/Behavioral model 402 wrapped in an RTL test wrapper 404, which is in turn wrapped within a smart wrapper 406. Input pins 408 extend through the smart wrapper 406 and into the RTL test wrapper 404, and output pins 410 extend from the RTL test wrapper 404 and through the smart wrapper 406. Input test pins 412 and output test pins 414 are also provided, but pins 412 and 414 are shown in phantom because they are not exposed at the top level.

The smart wrapper 406 is used if the unsynthesized RTL macro 400 requires, for example, test structures other than scan automatic test pattern generation (ATPG), such as for memories, for joint-test-action group based (JTAG-based) BIST (built-in self test), and the like. The core designer delivers the RTL model 402, the RTL test wrapper 404, and the RTL smart wrapper 406.

The smart wrapper 406 can include "assertions". An assertion is a value or expectation placed on one or more elements, such as a test pin. During functional testing, the assertion can be used by a computer-aided design tool to test a parameter associated with the module, such as whether the wire hookups are correct, whether the signal path is complete, and so on. The smart wrapper 406 provides a means for static formal testing of the layout and wiring, without requiring test vectors and/or dynamic inputs, such as time-varying signals.

In general, the customer identifies RTL modules that require test signal wiring, such as an RTL model with pre-inserted test multiplexers. A computer-based design tool (shown in FIG. 10) can generate the smart wrapper for the customer when the RTL model includes such pre-inserted test structures.

Figure 4B:
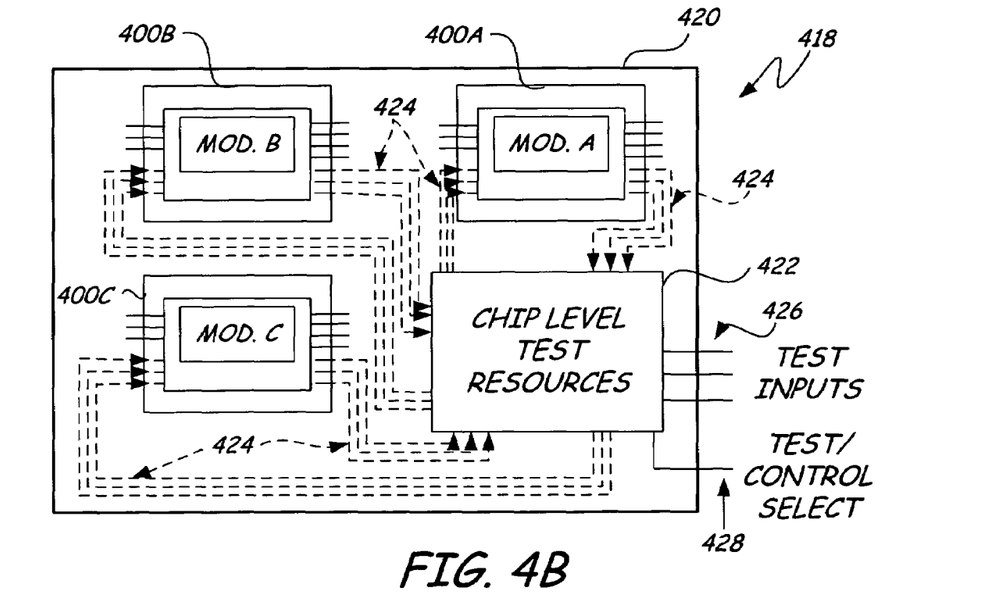
FIG. 4B is a simplified block diagram of a circuit layout pattern with a plurality of circuit modules connected to chip level test resources according to an embodiment of the present invention.

FIG. 4B illustrates a simplified block diagram of a circuit layout pattern 418 with a plurality of macros 400, such as that shown in FIG. 4A. It should be understood that the macros 400A-400C can be unsynthesized RTL code, placed and routed macros (such as a netlist with placement and routing information), a netlist without placement information, or any combination, depending on the specific implementation. Moreover, a chip layout 420 can include any number of such macros, interconnected in a variety of ways to produce the desired functionality.

The circuit layout pattern 418 is provided with chip level test resources 422. The chip level test resources 422 are coupled by logical connections 424 to the test pins 412,414 (shown in FIG. 4A). Test inputs 426 provide a means for dynamic testing of the modules A, B and C (400A, 400B and 400C, respectively), and test control/select 428 provides a means for selecting between macros 400 (modules) for macro specific testing, as needed.

Figure 5:
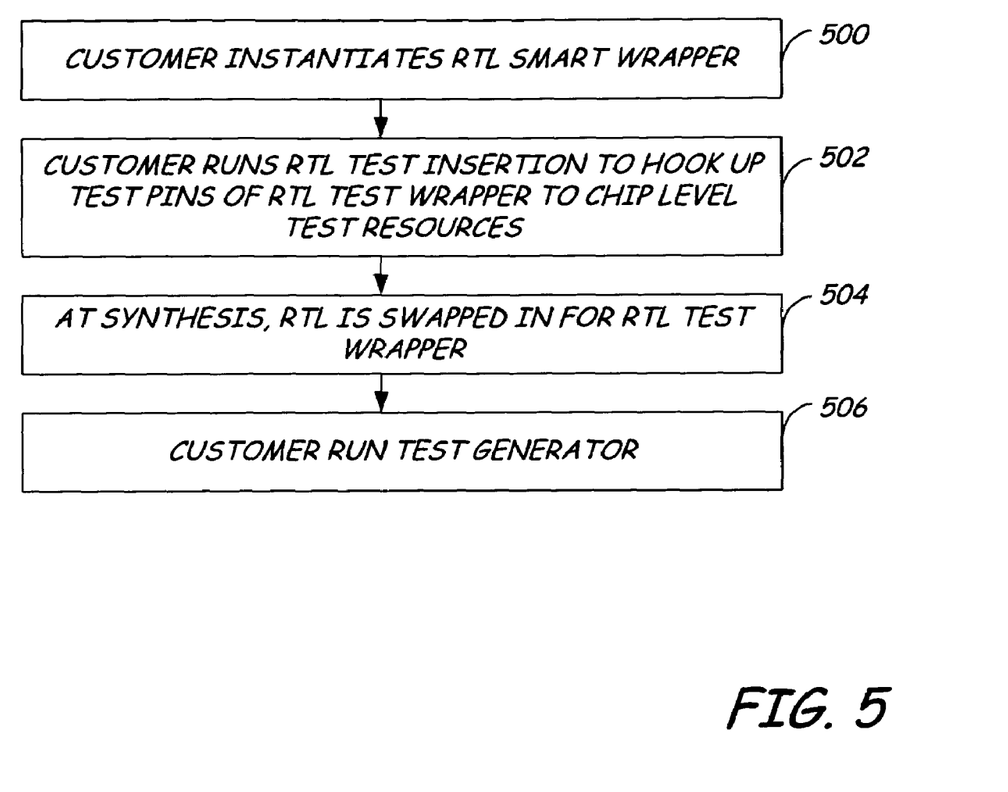
FIG. 5 is a simplified flow diagram of a process for use of smart wrapper and RTL test wrapper insertion according to an embodiment of the present invention.

FIG. 5 is a simplified flow diagram of the customer design flow for the unsynthesized RTL macro of FIG. 4. The customer instantiates the RTL smart wrapper (step 500). The customer runs RTL test insertion to hook up test pins of the RTL test wrapper to chip level test resources (step 502). At synthesis, the RTL model is synthesized such that it matches the pinout of the RTL test wrapper (step 504). This is done in such a way that the previously connected test pins that are now connected to chip-level test resources are fully connected to the logic within the core module. Finally, the customer runs a test generator (step 506), which inserts scan chains and pulls asynchronous pins up for testing. While the above-discussion is directed to operator-initiated steps, the steps can be implemented in an automated, computer-aided process wherein a computer-based design tool performs each of the operations.

Figure 6:
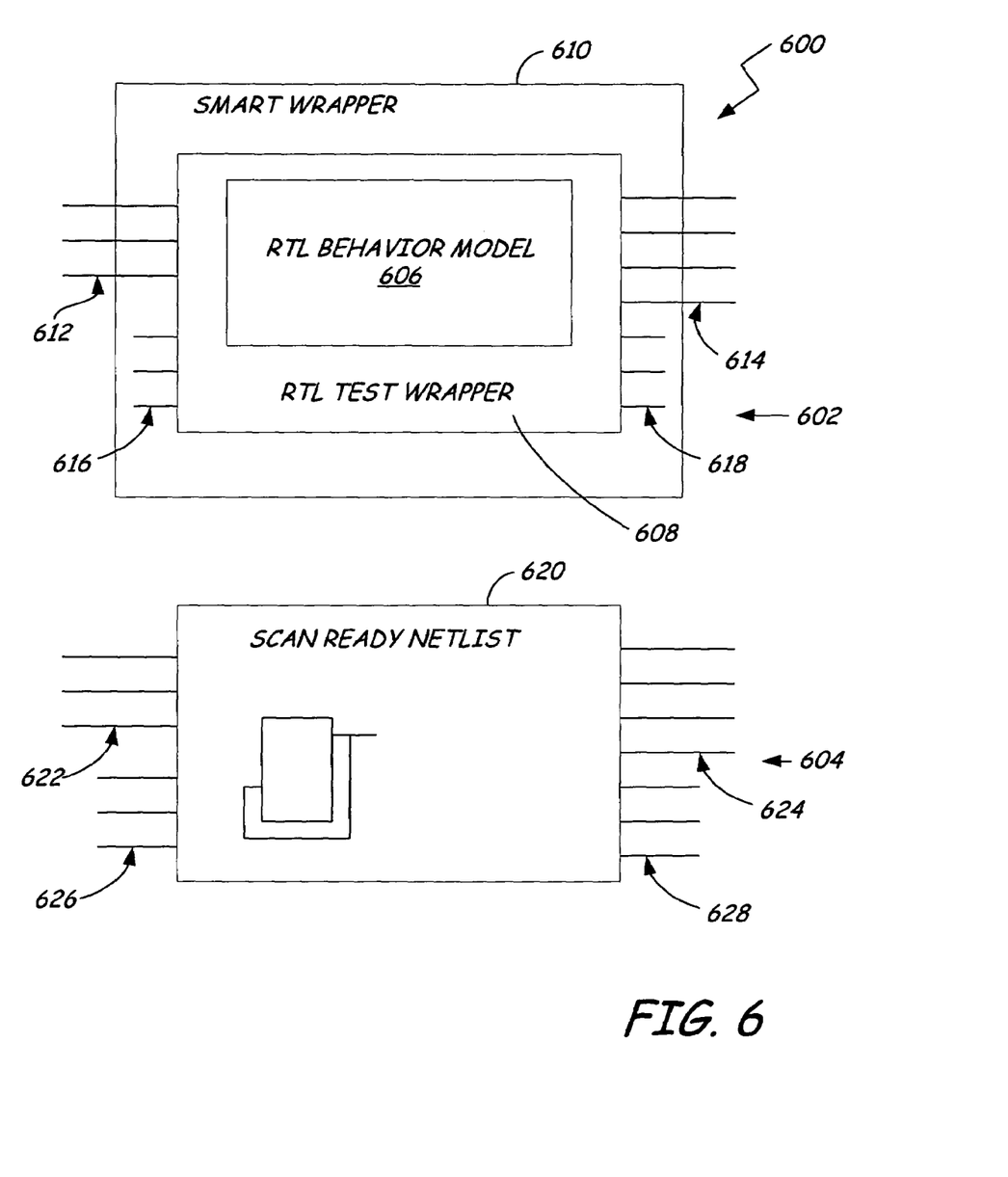
FIG. 6 is a simplified block diagram of a smart wrapper and scan ready netlist according to an embodiment of the present invention.

FIG. 6 is a simplified block diagram of a smart wrapper for a netlist without placement information macro 600 according to an embodiment of the present invention. The netlist without placement information macro 600 includes an RTL version 602 and a netlist version 604. The RTL version 602 includes an RTL/Behavioral model 606 wrapped by an RTL test wrapper 608, which is in turn wrapped by smart wrapper 610. Input pins 612 and output pins 614 extend through the smart wrapper 610 to the test wrapper 608. Input test pins 616 and output test pins 618 extend from the test wrapper 608, but no test pins extend at the top level.

The netlist version 604 includes a scan ready netlist 620 with input pins 622 and output pins 624, as well as input test pins 626 and output test pins 628, which match pins 612, 614, 616 and 618 of the RTL version 602.

Generally, the core designer delivers the RTL model 606, the RTL test wrapper 608, the RTL smart wrapper 610 and the netlist 620 to the customer. The module name of the RTL test wrapper 608 and pinout match that of the netlist 620. The RTL smart wrapper 610 is a non-test wrapper, which instantiates the RTL test wrapper 608.

Preferably, the RTL test wrapper 608 and the scan ready netlist 620 have the same module name and pinout. Generally, netlist test insertion is required for gate resets, embedded memories, internally generated clocks and resets, JTAG-based BIST schemes, and the like.

Once the core designer provides the RTL model 606, the RTL wrapper 608, the smart wrapper 610 and the netlist 620, the customer can instantiate the RTL smart wrapper 610. The customer can then run an RTL test insertion routine (within for example a computer-aided IC design tool) to hook up test pins of the RTL test wrapper 608 to chip level test resources. At synthesis, the netlist 620 and associated pins 622, 624, 626 and 628 are swapped in for RTL test wrapper 608 and associated pins 612, 614, 616 and 618.

Figure 7:
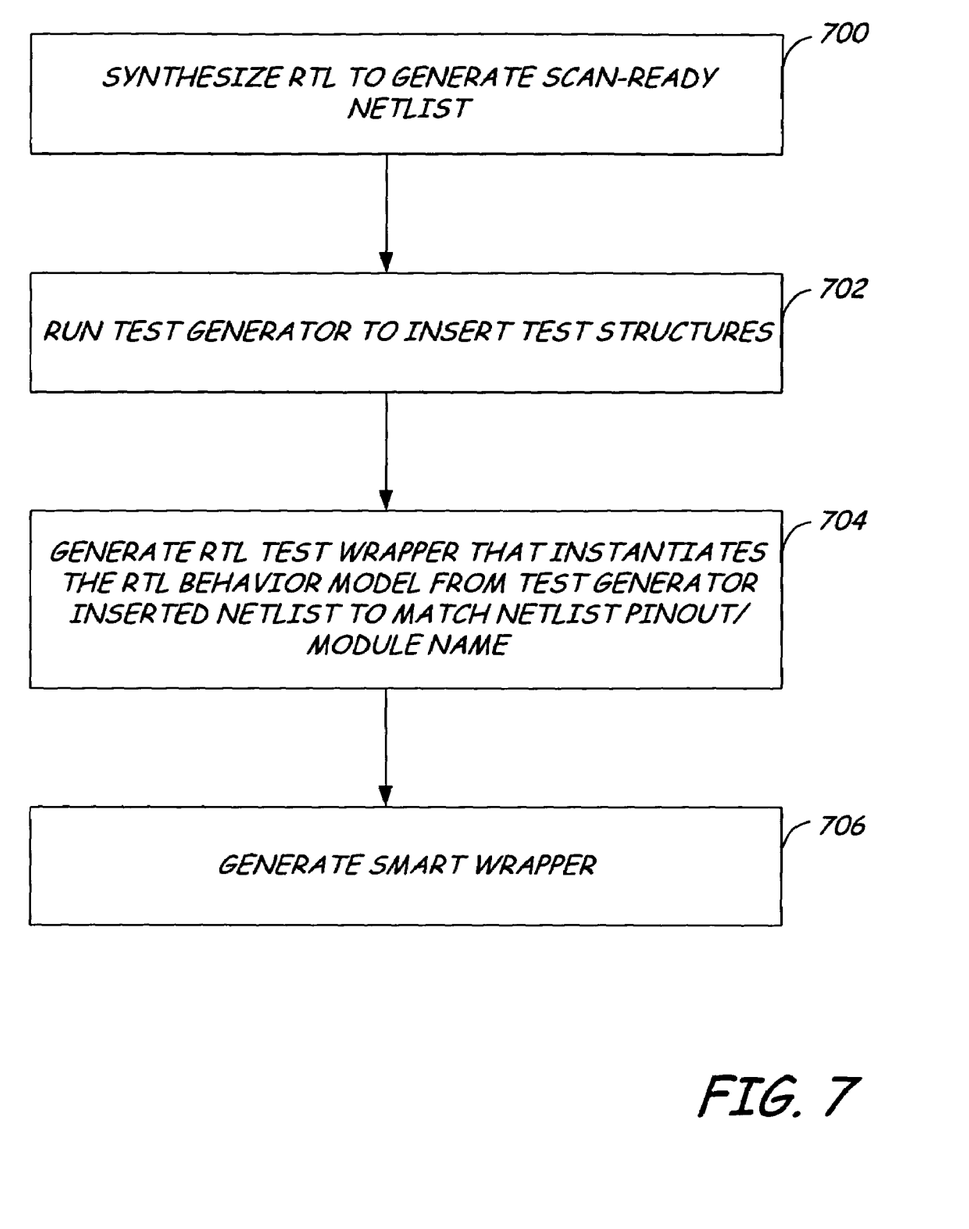
FIG. 7 is a simplified flow diagram of a process for automated RTL test wrapper generation according to an embodiment of the present invention.

FIG. 7 illustrates a simplified block diagram of a design flow for smart wrapper generation for netlist without placement information macros according to an embodiment of the present invention. Once the RTL module description has been created, a computer-aided IC design system can synthesize the RTL to generate a scan-ready netlist (step 700). The system then runs a test generation algorithm to insert test structures (step 702), such as a memory test bus, embedded JTAG signals, a test clock multiplexer for internally generated clocks, a test reset multiplexer for internally generated asynchronous resets, and other test logic. The system generates an RTL test wrapper that instantiates the RTL behavior model from the generator inserted netlist to match the netlist pinout and module name (step 704). The system generates a smart wrapper concurrent with the RTL test wrapper for instantiating the RTL test wrapper (step 706).

The smart wrapper, in addition to instantiating the RTL test wrapper, ties off test pins and adds assertions to one or more of the test pins. An assertion is, for example, a Verilog construct within the design that can be used to test interconnections and the like. Another example of an assertion is a value placed on a test pin. One example of assertions includes System Verilog Assertions (SVA), which is an assertion language. An example of a standard Verilog library of assertions would be the Open Verification Library (OVL). Assertions allow the designer to assign expectations within the smart wrapper for a particular input or output. If the expectation created by the assertion is met, then the particular module passes testing.

Assertions within the smart wrapper can be used for test signals for both static formal checks (formal model checking) and dynamic formal checks (assertion-based verification simulation). Both dynamic assertion checking and static formal checks verify that all signals are connected properly.

Static formal checks do not require a stimulus to test, and the assertions provide a tool for analyzing the circuit element behavior without stimulus.

Figure 8:
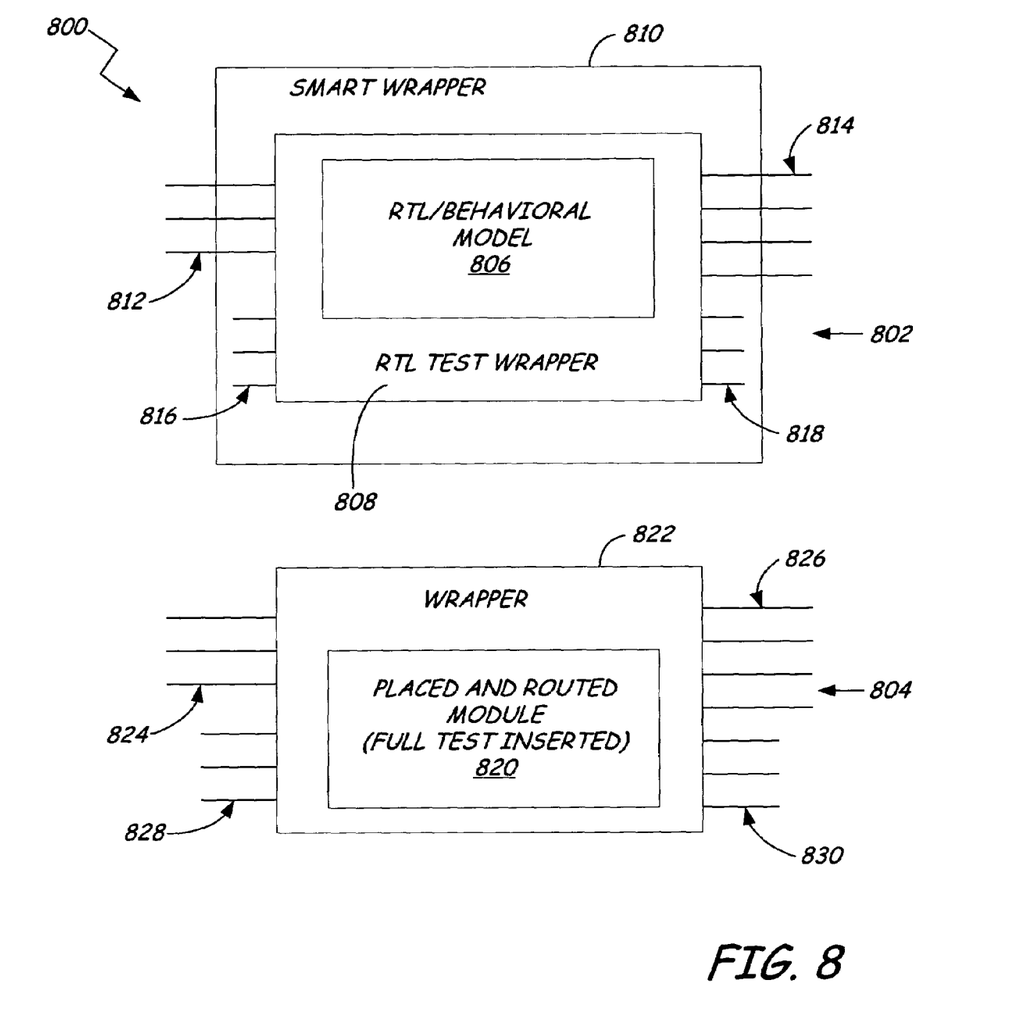
FIG. 8 is a simplified block diagram of an RTL/Behavioral model with RTL test wrapper and smart wrapper for placed and routed macros or mixed-signal cores according to an embodiment of the present invention.

FIG. 8 is a simplified block diagram of a hard macro 800 implementation using a smart wrapper according to an embodiment of the present invention. The hard macro 800 includes an RTL component 802 and a placed and routed component 804, such as a placed and routed RCell. The RTL component 802 includes an RTL/Behavioral model 806 wrapped by an RTL test wrapper 808, which is in turn wrapped by a smart wrapper 810. Input pins 812 and output pins 814 extend through the smart wrapper 810 to the test wrapper 808. Input test pins 816 and output test pins 818 extend from the RTL test wrapper 808, but do not extend through the smart wrapper 810 and are not exposed at the top level.

The placed and routed component 804 includes a placed and routed RCell 820 with a full test structure inserted. The placed and routed RCell 820 is wrapped within a wrapper 822. Input pins 824 and output pins 826 extend from the wrapper 822. Additionally, input test pins 828 and output test pins 830 extend from the wrapper 822. The RTL test wrapper 808 and the wrapper 822 have the same module name, and the pinouts match the netlist.

The core designer provides the RTL model 806, the RTL test wrapper 808, the smart wrapper 810 and the associated netlist (which in this instance is the Hard RCell 820). The RTL smart wrapper 810 is a non-test wrapper that instantiates the RTL test wrapper 808.

Figure 9:
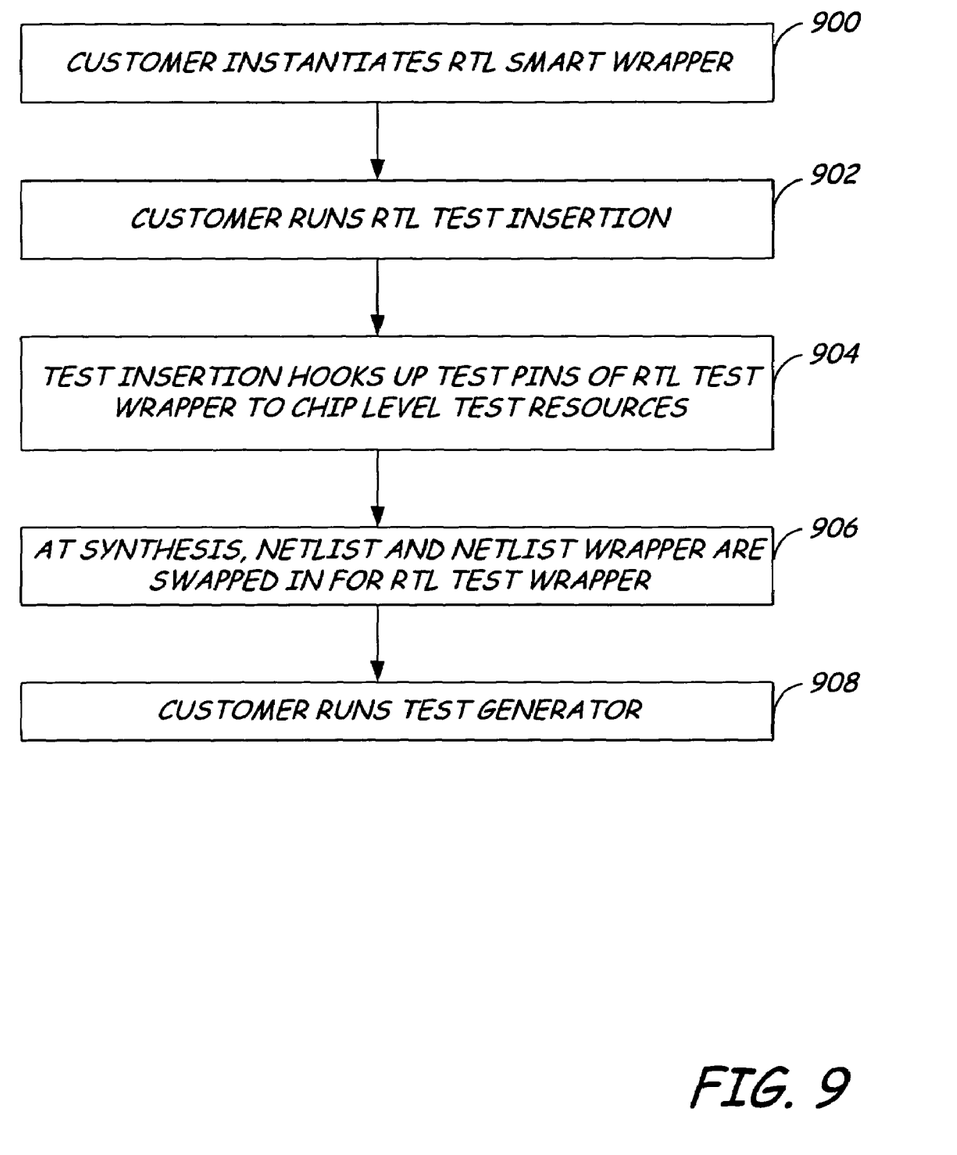
FIG. 9 is a simplified flow diagram of a process for test insertion for an unplaced netlist according to an embodiment of the present invention.

FIG. 9 illustrates a simplified flow diagram of a design flow implementing the smart wrapper with a Hard macro according to an embodiment of the present invention. The customer instantiates the RTL smart wrapper (step 900). The customer runs the RTL test insertion algorithm of a computer-aided design tool (step 902). The test insertion algorithm hooks up test pins of the RTL test wrapper to chip level test resources (step 904). At synthesis, the hard RCell and wrapper are swapped in for the RTL test wrapper (step 906). The customer then runs a test generator (step 908).

TABLE 1 is a simplified example of Verilog code describing an RTL test wrapper for an RTL module (called "IP_Block_1_wrapper"). The code snippets include explanatory comments.

TABLE 1

```
// Verilog Wrapper for Module "IP_Block_1_wrapper"
//
// Description: This module instantiates the block
//"IP_Block_1_wrapper" and exposes all test signals.
//
module IP_Block_1_Wrapper (FuncSigIn_1, FuncSigIn_2,
FuncSigOut_1, FuncSigOut_2, TestSigIn_1, TestSigIn_2,
TestSigOut_1, TestSigOut_2);
// input pin declaration
    input FuncSigIn_1;
    input FuncSigIn_2;
    input TestSigIn_1;
    input TestSigIn_2;
// output pin declaration
    output FuncSigOut_1;
    output FuncSigOut_2;
    output TestSigOut_1;
    output TestSigOut_2;
// Wires & assignment statements
    wire unconnected_1, unconnected_2;
// Instantiation of IP_Block_1 with test pins
    IP_Block_1
IP_Block_1_inst0(.FuncSigIn_1(FuncSigIn_1),
.FuncSigIn_2(FuncSigIn_2),
.FuncSigOut_1(FuncSigOut_1),.FuncSigOut_2(FuncSigOut_
```

TABLE 1-continued

```
2)
    );
endmodule
```

Thus, instantiation of a test wrapper for IP block 1 instantiates the block and manufactures the existence of test pins, which can be tied off at the next level (such as the smart wrapper of TABLE 2) or which can be pulled up the design hierarchy and connected to chip level test resources.

TABLE 2 is a simplified example of Verilog code describing a smart wrapper for an RTL module (called "IP_Block_smart"). The smart wrapper ties off the test pins manufactured by the code in TABLE 1 above. The code snippets for the smart wrapper below include explanatory comments.

TABLE 2

```
// Verilog Wrapper for Module "IP_Block_smart"
//
// Description: This module instantiates the block
//"IP_Block_smart" and ties off all test signals.
//
module       IP_Block_smart_Wrapper     (FuncSigIn_1,
FuncSigIn_2, FuncSigOut_1, FuncSigOut_2);
// input pin declaration
    input FuncSigIn_1;
    input FuncSigIn_2;
// output pin declaration
    output FuncSigOut_1;
    output FuncSigOut_2;
// Wires & assignment statements
    wire func_VDD,func_VSS;
    wire unconnected_1, unconnected_2;
    assign func_VDD = 1'b1;
    assign func_VSS = 1'b0;
// Instantiation of IP_Block_1 with test pins
// tied off
    IP_Block_1_wrapper
IP_Block_1_inst0(.FuncSigIn_1(FuncSigIn_1),
.FuncSigIn_2(FuncSigIn_2),
.FuncSigOut_1(FuncSigOut_1),.FuncSigOut_2(FuncSigOut_
2),   .TestSigIn_1(func_VSS), .TestSigIn_2(func_VSS),
    .TestSigOut_1(unconnected_1),
.TestSigOut_2(unconnected_2)
    );
//Assertions added to the test pins
assert (IP_Block_1_inst0.TestSigIn_1 == func_VSS);
    // Test Signal 1 is always = deasserted value
assert (IP_Block_1_inst0.TestSigIn_2 == func_VSS);
    // Test Signal 2 is always = deasserted value
endmodule
```

Instantiation of the smart wrapper (of Table 2) triggers instantiation of the IP block wrapper (of Table 1). The test-signal-in pins are assigned to a deasserted (non-asserted) state, so that the test circuitry (if it exists) is not activated. In this instance, the test pin inputs are tied to the active low state, which, for the example, represents a non-asserted state. Thus, the test pins are tied off by the smart wrapper. Since the test pins are now represented at the test wrapper level, the pins can be pulled up the design hierarchy and connected (through the smart wrapper) to chip-level test resources as an RTL test insertion step.

A cycle-to-cycle check to verify that the signals do not change state could be applied to the example of TABLE 2; however, we do not necessarily have knowledge or access to any clocks for verification purposes, in the example provided. Nevertheless, it should be understood that the clock information can be used to verify the cycle-to-cycle state of the test pins in the example shown in TABLE 2.

If clocks were used, the assertions could read as shown in TABLE 3.

TABLE 3

```
//Assertions using clocks
    assert ( IP_Block_1_inst0.TestSigIn_1 |=>
        IP_Block_1_inst0.TestSigIn_1);
    // Test Signal 1 HI never changes value
    assert (!IP_Block_1_inst0.TestSigIn_1
        |=>!IP_Block_1_inst0.TestSigIn_1);
    // Test Signal 1 LO never changes value
    assert ( IP_Block_1_inst0.TestSigIn_2 |=>
        IP_Block_1_inst0.TestSigIn_2);
    // Test Signal 2 LOW never changes value
        assert (!IP_Block_1_inst0.TestSigIn_2
            |=>!IP_Block_1_inst0.TestSigIn_2);
    // Test Signal 2 HI never changes value
```

The assertions are used to test both logic HI and logic LOW values.

It is also possible to apply assertions at the top level of the design hierarchy to verify proper connectivity. For example, from the perspective of a module that instantiates the module shown, for example, in TABLE 1, the assertions could read as shown below in TABLE 4.

TABLE 4

```
//Assertions at the top level of the design hierarchy
assert (TestSigIn_1
    ==IP_Block_1_Wrapper_inst0.IP_Block_1_inst0
    .TestSigIn_1);
    // Test Signal 1 is properly connected through
    // the hierarchy
assert (TestSigIn_2
    ==IP_Block_1_Wrapper_inst0.IP_Block_1_inst0
    .TestSigIn_2);
    // Test Signal 2 is properly connected through
    // the hierarchy
```

In one embodiment, the smart wrapper and test wrapper allow for circuit modules and for third-party modules to be inserted and tested, without having direct access to test structures of the module. If the hard macro is provided without test structures, assertions of the smart wrapper are used to test signal connections, and the module itself can be tested using third-party provided test vectors through the smart wrapper.

Figure 10:
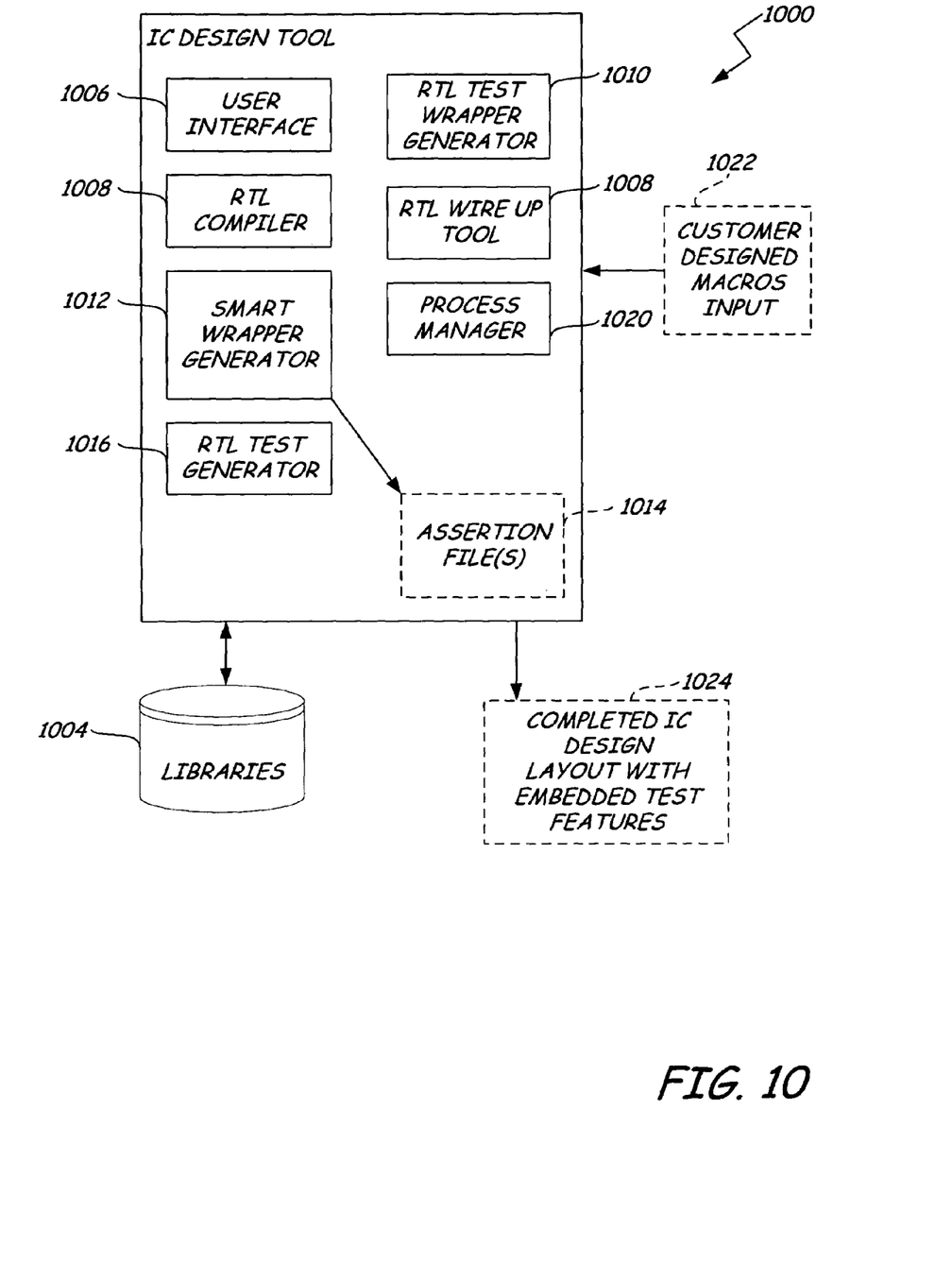
FIG. 10 is a simplified block diagram of a computer-aided design tool for automated test insertion according to an embodiment of the present invention.

FIG. 10 is a simplified block diagram of an integrated circuit design system 1000 for implementing smart wrappers in custom IC design according to an embodiment of the present invention. The system 1000 includes a design tool 1002 with libraries 1004 (which can be a data file containing cell libraries, macros, cores, modules, and the like) describing pre-defined modules. The design tool 1002 includes a user interface 1006, an RTL wireup tool 1008, an RTL test wrapper generator 1010, a smart wrapper generator 1012, an RTL test generator 1016 and an RTL compiler 1018. One or more assertion files 1014 may optionally be provided separately from the smart wrapper generator 1012 for defining assertions to be included in particular smart wrapper instantiations. Finally, the design tool 1002 can include a process manager feature 1020 for monitoring and managing various stages of the design and synthesis process of each IC design.

A customer can use design tool 1002 by, for example, loading a macro, such as a customer designed macro 1022, a third party macro, or other pre-designed logic or arithmetic function module. The customer can then select modules from the libraries 1004 via the user interface 1006, and then can wire the selected modules to the input macro 1022 using the RTL wireup tool 1008. The customer can use the design tool 1002 to generate tests using the test generator 1016, to generate RTL test wrappers using the RTL test wrapper generator 1010, and to generate smart wrappers with assertions using the smart wrapper generator 1012 and optionally one or more assertion files 1014. Finally, the design tool 1002 can be used to compile the RTL to generate the design layout with test features.

Figure 11:
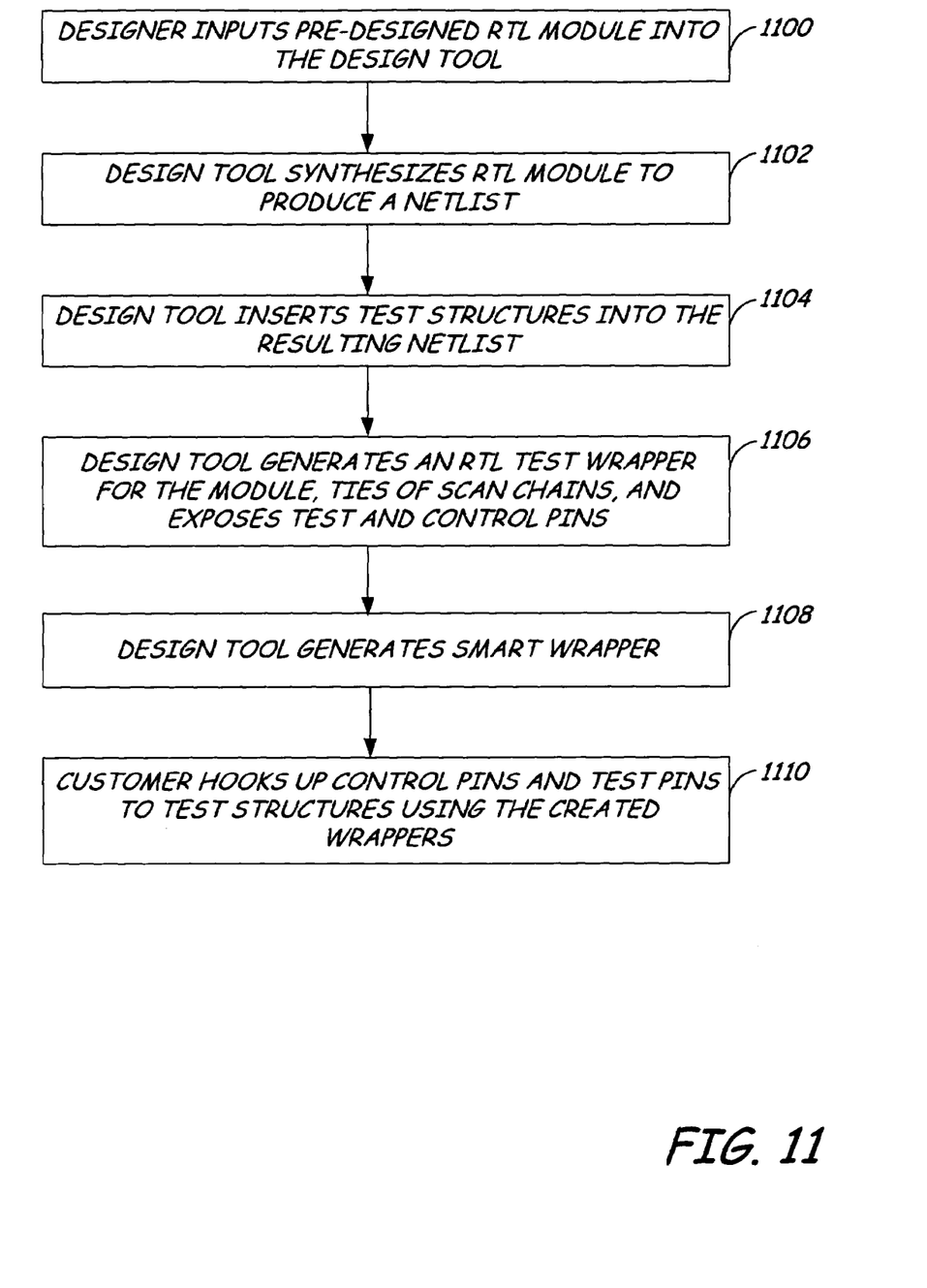
FIG. 11 is a simplified flow diagram for test wrapper insertion according to an embodiment of the present invention.

FIG. 11 is a simplified flow diagram of a computer-aided IC design flow according to an embodiment of the present invention. In general, the system allows the module or core designer to create the test wrappers for the module or core (steps 1100-1110). Once the wrappers have been created, the design flow allows the customer to perform test insertion through the smart wrapper at an RTL level (in step 1112). The designer inputs one or more pre-designed RTL modules into the design tool (step 1100). The designer then uses the design tool to synthesize the RTL module to produce a netlist (step 1102). The design tool inserts test structures into the resulting netlist (step 1104). The design tool generates an RTL test wrapper for the module from the previous step, ties off scan chains, and exposes test and control pins (step 1106). The design tool generates a smart wrapper (step 1108) to enable the hook up of block level test pins of the test wrapper to chip level test pins and to test the hookups. Finally, the customer uses the created wrappers to hook up test pins and control pins to test structures (step 1110).

One advantage provided by embodiments of the present invention is that the smart wrapper together appear to the design tool as if test structures are included in the module. By providing means for test hookup through the RTL wrappers, the design hookup can proceed with all modules, including those without test structures, thereby simplifying the overall design and test process. Moreover, by providing a means for the customer to generate and insert test structures during the RTL design phase, embodiments of the present invention provide test means without modifying the module and without altering timing or other performance considerations.

Although the present invention has been described with reference to preferred embodiments, workers skilled in the art will recognize that changes may be made in form and detail without departing from the spirit and scope of the invention.

What is claimed is:

1. A system for RTL test insertion in an integrated circuit layout pattern, the system comprising:
    a core module describing a function defined by logical elements, interconnections between logical elements, input pins and output pins;
    a test wrapper, which encapsulates the core module, comprises input pins and output pins corresponding to the input pins and output pins of the core module, and creates test pins for the core module regardless of whether the core module includes test structures with corresponding test pins; and
    a smart wrapper, which encapsulates the test wrapper and comprises input pins and output pins corresponding to the input pins and output pins of the test wrapper, wherein the smart wrapper hides the test pins and assigns the test pins to a non-asserted state, wherein the smart wrapper places an assertion on one or more of the test pins for static or dynamic testing of the integrated circuit layout pattern.

2. The system of claim 1 wherein the test wrapper and the smart wrapper comprise computer readable blocks of RTL code.

3. The system of claim 1 further comprising:
chip-level test resources coupled to gate-level test structures of the core module that are swapped in at the gate-level for the RTL-level test pins of test wrapper.

4. The system of claim 1 wherein the core module comprises gate-level test structures, and wherein the test pins of the test wrapper correspond to pins of the gate-level test structures.

5. The system of claim 1 wherein the core module comprises a placed and routed macro, and wherein the test wrapper represents test structures to a design tool for the core module that does not include test structures.

6. A system for test insertion within an integrated circuit layout pattern, the system comprising:
a core module describing a function defined by logical elements, interconnections between logical elements, input pins and output pins, the core module defining a test structure with module test pins;
an RTL test wrapper, which encapsulates the core module, comprises input pins and output pins corresponding to the input pins and output pins of the core module, and creates test pins coupled to the module test pins; and
an RTL smart wrapper, which comprises input and output pins corresponding to the input pins and output pins of the RTL test wrapper, wherein the RTL smart wrapper ties off and hides test pins of the RTL test wrapper.

7. The system of claim 6 wherein the integrated circuit layout pattern comprises gate-level test resources, and wherein the test structure of the core module is coupled to the gate-level test resources through the smart wrapper by the test pins.

8. The system of claim 6 wherein the smart wrapper further comprises:
assertions, which assign at least one of a value or an expectation of the value to one or more test pins.

9. The system of claim 8 wherein the smart wrapper assigns the value to an input test pin for static formal model checking of the core module after test hookups are made to global test resources.

10. The system of claim 8 wherein the smart wrapper assigns the value to an input test pin for dynamic assertion-based verification of the core module.

11. The system of claim 8 wherein a change to the value during functional simulations is indicative of improper use of the test pin.

12. The system of claim 6 wherein the test pins of the test wrapper are tied to a non-asserted state by the smart wrapper.

13. A system for test insertion in an integrated circuit layout pattern, the system comprising:
a core module describing a function defined by logical elements, interconnections between logical elements, input pins and output pins;
a test wrapper, which encapsulates the core module comprises input pins and output pins corresponding to the input pins and output pins of the core module, and creates test pins representing test structures of the core module; and
a smart wrapper, which encapsulates the test wrapper, comprises input and output pins corresponding to the input pins and output pins of the RTL test wrapper, and assigns the test pins to a non-asserted state, and wherein the smart wrapper hides the test pins.

14. The system of claim 13 wherein the integrated circuit layout pattern comprises chip level test resources and wherein the core module is coupled to the chip level test resources though the smart wrapper by the test pins.

15. The system of claim 13 wherein the smart wrapper further comprises:
assertions placed on one or more test pins of the core module.

16. The system of claim 15 wherein the assertions comprise values for checking test pin connections statically through formal verification techniques.

17. The system of claim 13 wherein the non-asserted state comprises a value selected such that test structures of the core module are not activated.

18. The system of claim 13 wherein the core module comprises:
a core test structure;
core test input pins coupled to the core test structure, which receive a test input; and
core test output pins coupled to the core test structure, which deliver a test output from the core test structure;
wherein the core test input pins and the core test output pins are coupled to the test pins of the test wrapper at an RTL level.

19. The system of claim 13 wherein the core module, the test wrapper, and the smart wrapper comprise computer readable RTL code.

* * * * *